US010852360B2

(12) United States Patent
Brychta et al.

(10) Patent No.: US 10,852,360 B2
(45) Date of Patent: Dec. 1, 2020

(54) ADC INPUT CIRCUIT SENSING FOR FAULT DETECTION

(71) Applicant: Analog Devices International Unlimited Company, Limerick (IE)

(72) Inventors: Michal Brychta, Limerick (IE); Adrian Sherry, Raheen (IE)

(73) Assignee: Analog Devices International Unlimited Company, Limerick (IE)

( * ) Notice: Subject to any disclaimer, the term of this patent is extended or adjusted under 35 U.S.C. 154(b) by 298 days.

(21) Appl. No.: 15/937,363

(22) Filed: Mar. 27, 2018

(65) Prior Publication Data

US 2018/0284178 A1 Oct. 4, 2018

Related U.S. Application Data

(60) Provisional application No. 62/480,376, filed on Apr. 1, 2017.

(51) Int. Cl.
*G01R 31/50* (2020.01)
*H03M 1/12* (2006.01)
*G01R 31/08* (2020.01)

(52) U.S. Cl.
CPC .......... *G01R 31/50* (2020.01); *G01R 31/088* (2013.01); *H03M 1/12* (2013.01)

(58) Field of Classification Search
CPC ....... G01R 31/50; G01R 31/088; H03M 1/12; H03M 1/1215; H03M 1/121
(Continued)

(56) References Cited

U.S. PATENT DOCUMENTS 5,942,982 A    8/1999   Noble et al.
6,885,700 B1 *   4/2005   Kim .................... G01R 31/3016
                                                   375/224

(Continued)

FOREIGN PATENT DOCUMENTS

CN          101223698 A      7/2008
CN          102640006 A      8/2012
(Continued)

OTHER PUBLICATIONS

"Thermocouple EMF to Temperature Converter, ±1.5° C. Maximum Accuracy", Microchip Technology Inc. data sheet MCP9600, (2015), 51 pgs.
(Continued)

*Primary Examiner* — Vincent Q Nguyen
*Assistant Examiner* — Trung Nguyen
(74) *Attorney, Agent, or Firm* — Schwegman Lundberg & Woessner, P.A.

(57) ABSTRACT

A fault detection scheme can include use of a relatively high injection impedance between an input port for analog measurements from a sensor and a stimulus generation circuit controlled in coordination with analog measurement. The stimulus generation circuit can provide a stimulus signal through the injection impedance. A magnitude of the injection impedance can be specified relative to a source impedance associated with a source (e.g., a sensor or other device) coupled to the input port. For example, a magnitude of the injection impedance can be specified to be larger than the source impedance or the injection impedance magnitude can be specified to be a multiple of the source impedance.

20 Claims, 5 Drawing Sheets

(58) Field of Classification Search
USPC .. 324/500, 750.01, 329–348, 323, 447, 425, 324/200, 202–206, 256–259, 600, 637, 324/639
See application file for complete search history.

(56) References Cited

U.S. PATENT DOCUMENTS

| | | |
|---|---|---|
| 7,562,558 B2 | 7/2009 | Horner et al. |
| 9,983,032 B1 * | 5/2018 | Kraver .................... G01D 5/24 |

FOREIGN PATENT DOCUMENTS

| | | |
|---|---|---|
| CN | 102640374 A | 8/2012 |
| CN | 104459295 A | 3/2015 |
| JP | H11108997 A | 4/1999 |
| JP | 2004239925 A | 8/2004 |

OTHER PUBLICATIONS

"Using burnout current sources for Wheatstone bridge detection", Techoverflow, (Sep. 4, 2015), 4 pgs.

"Chinese Application Serial No. 201810282559.6, Office Action dated Jan. 21, 2020", w/ English Translation, 21 pgs.

"Chinese Application Serial No. 201810282559.6, Response filed Jun. 5, 2020 to Office Action dated Jan. 21, 2020", w/ English Claims, 19 pgs.

* cited by examiner

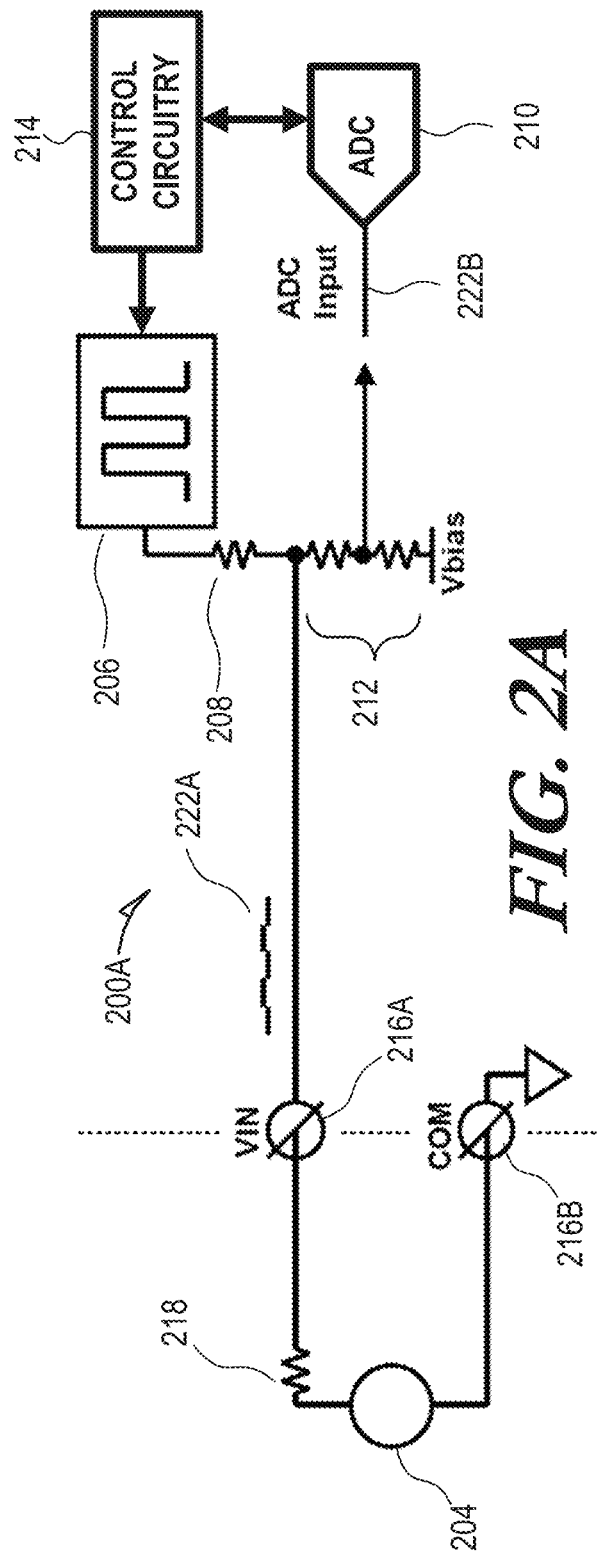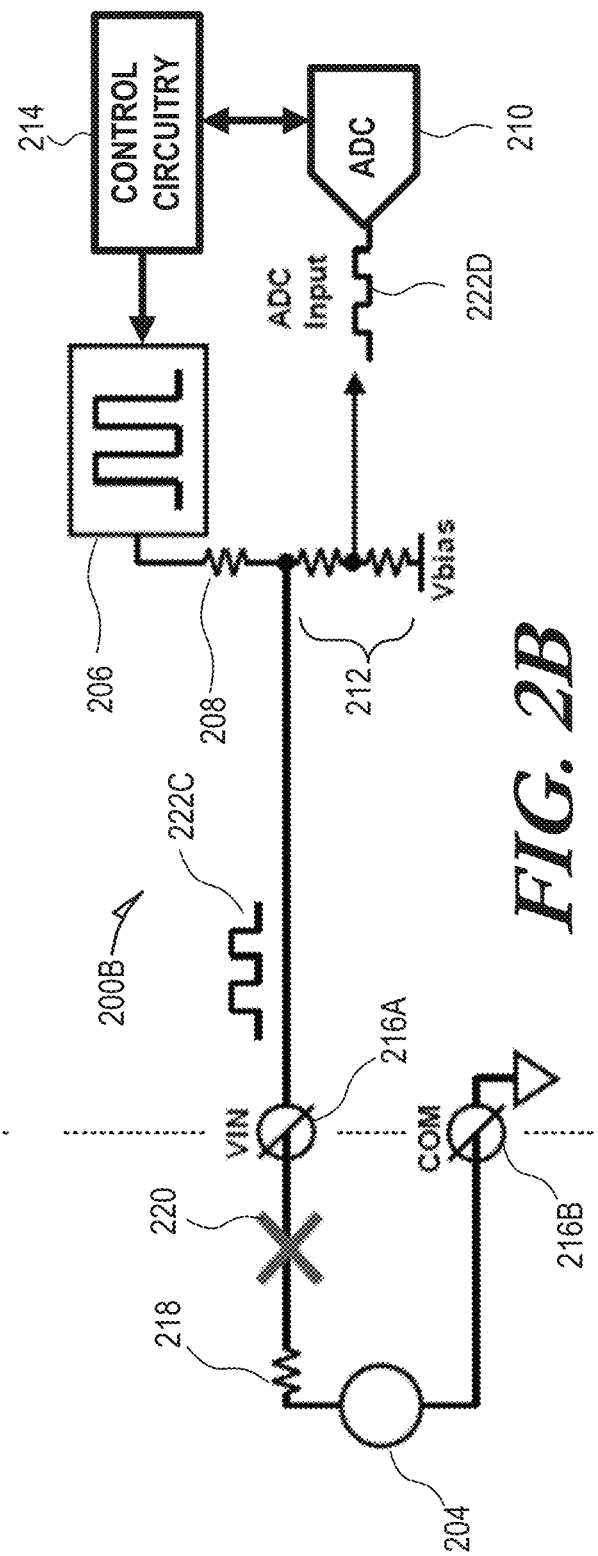

ADC INPUT CIRCUIT SENSING FOR FAULT DETECTION

CLAIM OF PRIORITY

This patent application claims the benefit of priority of Brychta, et al., U.S. Provisional Patent Application Ser. No. 62/480,376, titled "ADC INPUT CIRCUIT SENSING FOR FAULT DETECTION," filed on Apr. 1, 2017, which is hereby incorporated by reference herein in its entirety.

FIELD OF THE DISCLOSURE

This document pertains generally, but not by way of limitation, to an analog measurement circuit, such as including an analog-to-digital conversion (ADC) circuit, and more specifically to an ADC having another circuit, such as a divider circuit, coupled to an input of the ADC circuit.

BACKGROUND

Electronic circuits used for performing measurements of analog signals can include an analog measurement circuit, such as incorporating an analog-to-digital conversion (ADC) circuit. Such electronic circuits are generally implemented using semiconductor processing and related circuit configurations supporting a relatively limited input voltage range. According to various applications, such circuits can be used in operating environments where a voltage range outside the ADC circuit can span a considerably larger range than the ADC circuit can directly process. For example, signals in industrial environments might span ranges of +/−10 volts (V), +/−15V, or ranges having greater voltage magnitude, above or below a reference or "ground" voltage. In one approach, such higher voltage ranges can be scaled to the input of an ADC conversion circuit using a resistor divider circuit or other voltage scaling circuit. In a resistor divider circuit or other resistor "network," a ratio or relative value of the resistors can determine how much the voltage signal is scaled down (or attenuated), such that the output of the divider circuit is within a range that can be further processed by the ADC circuit.

SUMMARY OF THE DISCLOSURE

The present inventors have recognized, among other things, that use of a resistor divider circuit or other voltage scaling scheme at an analog measurement input can present a challenge to detection of faults in a signal path leading to the analog measurement input. For example, in a fault condition, a divider circuit at the analog measurement input may load an input in such a manner that a certain voltage appears at the input. Such a voltage might not be distinguishable to the analog measurement circuit from a valid input voltage. To address such a challenge, a detection scheme as described herein can include use of a relatively high injection impedance between an input port for analog measurements from a sensor and a stimulus generation circuit controlled in coordination with the analog measurement. The stimulus generation circuit can provide a stimulus signal through the injection impedance.

A magnitude of the injection impedance can be specified relative to a source impedance associated with a source (e.g., a sensor or other device) coupled to the input port, such that a ratio of the injection impedance and source impedance is above a specified threshold. In an example, a magnitude of the injection impedance can be specified to be larger than the source impedance. For example, the injection impedance can be a multiple of the source impedance. Generally, the injection impedance will also be greater in magnitude than an input impedance presented by the divider circuit at the analog measurement input.

An open-circuit or other condition causing an abnormally high impedance in the input signal chain leading to the input port can be detected, such as by detecting an increase in a magnitude of a representation of the stimulus signal present in resulting analog measurements as compared to normal (e.g., non-fault) operation.

In an example, an electronic system can be equipped to detect a fault in a signal path coupled to an input port of the electronic system, the electronic system comprising an analog measurement circuit configured to receive a signal from a source coupled to the input port, the analog measurement circuit comprising an analog-to-digital converter (ADC) circuit configured to provide a digital representation of the received signal from the source. The electronic system can include a stimulus generation circuit coupled to the input port through a first injection impedance, the first injection impedance having a value greater in magnitude than a source impedance associated with the source, and control circuitry coupled to the analog measurement circuit and the stimulus generation circuit. The control circuitry can be configured to control the stimulus generation circuit to generate a pulsed stimulus signal for fault detection, receive a representation of the pulsed stimulus signal using the analog measurement circuit, and to determine whether a fault exists in the signal path coupled to the input port at least in part using information about a magnitude of the representation of the pulsed stimulus signal received from the analog measurement circuit.

In an example, an electronic system can be equipped to detect a fault in a signal path coupled to an input port of the electronic system, the electronic system comprising an analog measurement circuit configured to receive a signal from a source coupled to a differential input comprising first and second input terminals; stimulus generation outputs coupled to the first and second input terminals through respective injection impedances. The electronic system can include control circuitry coupled to the analog measurement circuit. The control circuitry can be configured to control the stimulus generation outputs to generate a pulsed stimulus signal comprising respective signal components coupled to the first and second input terminals, receive a representation of the pulsed stimulus signal using the analog measurement circuit, and determine whether a fault exists in a signal path coupled to the input port at least in part using information about a magnitude of the representation of the pulsed stimulus signal received from the analog measurement circuit.

In an example, a technique, such as a method, can include detecting a fault in a signal path coupled to an input port of an electronic system, the method comprising using an analog measurement circuit, receiving a signal from a source coupled to an input port of the analog measurement circuit, injecting a pulsed stimulus signal through an injection impedance into the signal path, the injection impedance having a value greater in magnitude than a source impedance associated with the source, receiving a representation of the pulsed stimulus signal using the analog measurement circuit, and determining whether a fault exists in the signal path coupled to the input port at least in part using information about a magnitude of the received representation of the pulsed stimulus signal received from the analog measurement circuit. In an example, injecting the pulsed stimulus and performing analog signal acquisitions of the received signal from the source are accomplished in a synchronous manner, the analog signal acquisitions performed using the analog measurement circuit to receive the representation of the pulsed stimulus signal.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2A and FIG. 2B illustrate generally diagrams showing examples comprising an electronic system in the absence and presence, respectively, of a fault along a signal path leading from a signal source such as a sensor.

DETAILED DESCRIPTION

Figure 1:
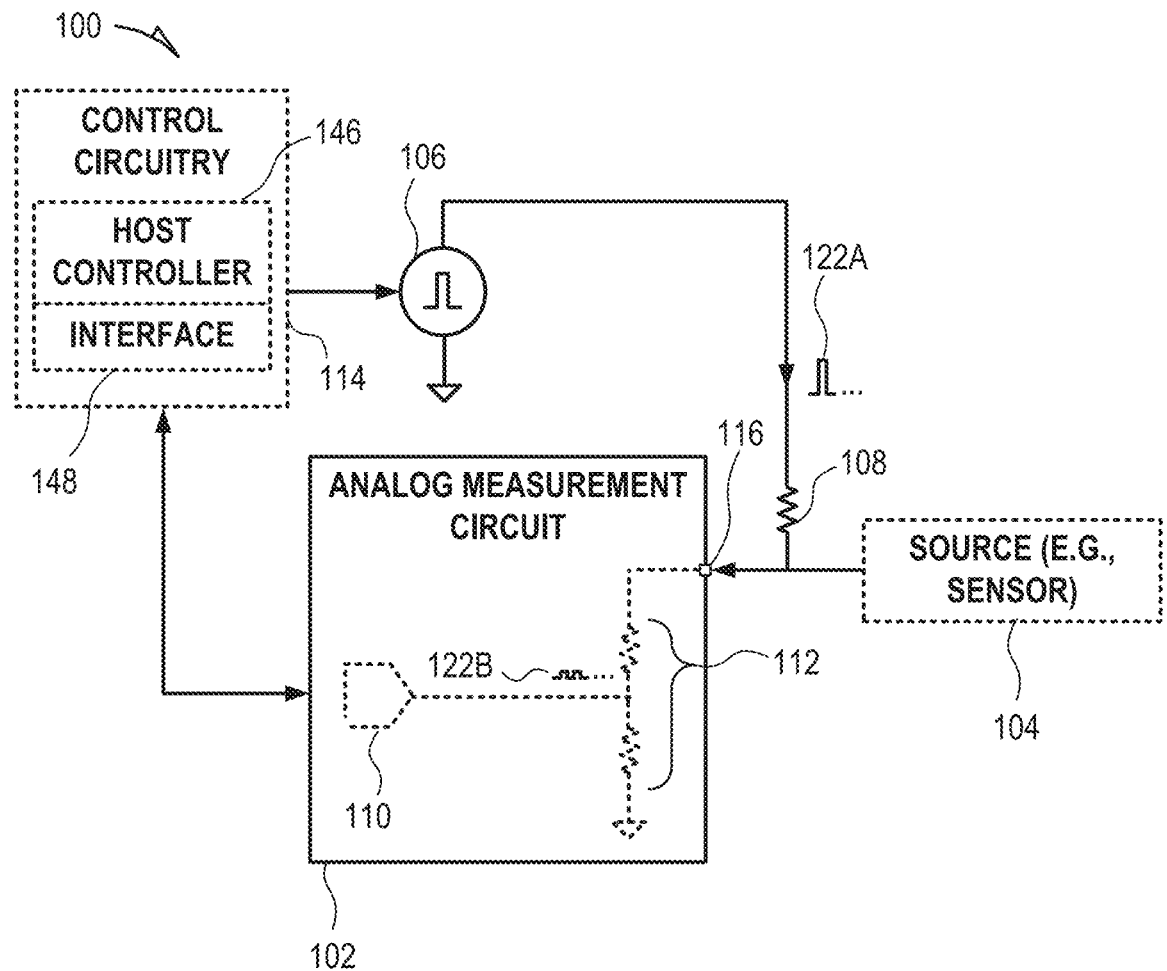
FIG. 1 illustrates generally a diagram showing an example, comprising an electronic system including control circuitry, an analog measurement circuit, and a stimulus generation circuit.

As mentioned above, an analog measurement circuit can include a resistor divider circuit or other scaling circuit coupled to an input of an ADC circuit to scale an input signal to a range usable by the ADC circuit. A signal path can be defined as including a source, such as a sensor or transducer, having a corresponding source impedance, along with any wiring or other interconnects coupling the source to an input of the analog measurement circuit. In a variety of applications, the source impedance is less in magnitude than an input impedance presented by an analog measurement circuit including the divider circuit and the ADC circuit. The present inventors have recognized that a divider circuit at the analog measurement input may load an input in such a manner that a certain voltage appears at the input. Such a voltage might not be distinguishable to the analog measurement circuit from a valid input voltage.

For example, in certain industrial systems, a signal path leading to an input of the analog measurement circuit may traverse a long distance along wires or cables, and such wiring or cabling could be improperly wired, cut, otherwise damaged, or pulled loose accidentally. In such a condition, the resistor divider circuit can pull an ADC input node toward some characteristic voltage (for example, to a ground reference voltage, to an intermediate reference voltage, "Vbias," or to a power-supply rail voltage, "Vdd" (e.g., an ADC power-supply node) or some combination of these voltages) as may be established by a particular divider circuit configuration. In such a state, an output of the resistor divider circuit coupled to the ADC input, might still result in a plausible input signal. As an illustrative example, if a valid input voltage range to the divider spans from −10V to +10V then a resistor divider circuit that pulls the faulted 'floating' inputs to approx. 2.5V would be seen as a valid output to the ADC, and the measurement system would not detect that the desired input has become disconnected or is being distorted (e.g., biased).

In one approach, an open-circuit condition in the input signal can be detected by placing a high input impendence buffer/amplifier in between the input signal and the resistor divider, along with a pull-up or pull-down resistor coupled to the amplifier input (possibly also including a multiplexer to allow selecting one of several inputs). Such an amplifier would generally be coupled to supply voltage nodes having a magnitude higher than the ADC circuit, such as a voltage supply having values of plus-or-minus 15V or even plus-or-minus 24V to allow the amplifier to process the input signals before such signals are run through the divider circuit. In such an approach, for example, a pull-up resistance can be coupled between the input signal and a high voltage power supply node to allow detection of open-circuit input.

In such an approach, if the amplifier input is open-circuited, a high-value pull-up or pull-down resistor will pull the amplifier input up to a value at or near the power-supply node value, such as +15V or −15V, as illustrative examples. Such a voltage can be well outside a normal range of values presented to the measurement circuit, and therefore the measurement system can detect the condition when the ADC input is drawn toward an upper or lower limit of the ADC circuit input range. In such an approach, a current source can be used in place of a pull-up or pull-down resistor. In these illustrative examples, if the input is differential, a corresponding resistor or current source can be included at each input node (e.g., inverting input and non-inverting input) of the amplifier or separate amplifiers can be used for each input, with each amplifier having a corresponding pull-up or pull-down resistor. For example, a pull-down resistor could pull a negative terminal to at or near a negative voltage supply value, e.g., −15V, so that an open-circuit pulls again results in an invalid voltage when detected by the ADC.

The present inventors have recognized that such amplifier-based approaches can present challenges. An amplifier-based approach has the added cost and complexity of a high-voltage-capable amplifier (which may be shared among multiple channels if a multiplexer is also used). Also, such an approach generally involves use of a separate higher-voltage supply as compared to the ADC core voltage, within an integrated circuit or integrated circuit package.

The present inventors have recognized that the circuits and techniques described herein can address such challenges. As an example, a detection scheme as described herein can include use of an injection impedance between an input port of an analog measurement circuit and an output of a stimulus generation circuit configured to provide a pulsed stimulus signal, such as providing stimulus controlled in coordination with (e.g., synchronous with acquisitions by) an ADC circuit included as a portion of the analog measurement circuit. Using pulsed stimulus (e.g., "AC" stimulus), does not require use of a buffer or amplifier having a separate supply voltage. A magnitude or other value of the injection impedance (e.g., an injection resistor value) can be specified such that the injection impedance is greater in magnitude than a source impedance provided by a source coupled to the analog measurement circuit, such as in frequency range of interest corresponding to pulsed stimulus used for fault detection. Various examples are shown illustratively in FIG. 1, FIG. 2A, FIG. 2B, and FIG. 3.

A similar fault detection scheme can be used for each terminal of an input port in a differential topology. For example, a second resistor divider circuit or other voltage scaling circuit can be coupled to a second differential ADC input and also connected to a similar injection impedance, and this second injection impedance can be connected to an additional pulsed stimulus output controlled in coordination with the ADC circuit, such as shown in the illustrative example of FIG. 4. If the ADC is implemented as a portion of an integrated circuit, the stimulus signal can be generated and controlled using circuitry co-integrated with the ADC conversion circuitry.

Generally, the circuits and techniques described herein are applicable to open-wire detection (or other similar faults, such as an unwanted high-impedance condition) as a system diagnostic that can be used to recognize that an external sensor or source signal has been disconnected from a system input. As mentioned elsewhere herein, in a system with a relatively high input impedance, in one approach, a diagnostic technique can be implemented such as using a pull-up resistor on the order of about 10 MΩ biased to, for example, +15V. In such an approach, when the signal path to a voltage input terminal is disconnected due to mis-wiring or a fault, the voltage input is pulled out of the normal operating range of, for example, +10V, and such a deviation can be recognized as an over-range in the ADC circuit output data.

But, as mentioned above, an approach exclusively based on a pull-up resistor can present challenges. The present inventors have recognized that in an example having an input resistive divider, a pull-up resistor may not function adequately, as such a resistor would be loaded by, for example, a 1 MΩ impedance presented by a resistor divider. Also, if the ADC is powered by a single supply, a system using a pull-up technique for open-circuit detection may not be able to support input voltages beyond a magnitude of a single power supply circuit, such as around 10V, as an example.

The present inventors have developed an approach using a pulsed stimulus signal that can be injected, for example, into a resistor divider input through an injection resistor. Open-wire or other fault detection can be implemented by processing of ADC output data in either a host controller coupled to the ADC circuit, or in an integrated or embedded system. The pulsed stimulus signal can include a square-wave (e.g., though "square-wave" can also refer a trapezoidally-shaped wave representing pulsed binary-valued signals having finite risetime or decay time). Such a pulsed stimulus signal can have an amplitude of 3.3V or 5V (depending on the power supply voltage), or other values, according to illustrative examples. The pulsed stimulus signal is generally shown as a time-varying voltage in the examples herein, but such stimulus can also be provided using controlled circuit sources, such as by injecting a time-varying current having a specified amplitude into the input node. Such current-mode stimulus can include use of a resistor in series with the current source, but such a series resistor can instead be omitted, such as where the current-mode stimulus source is robust to withstand voltages present at the input terminal.

FIG. 1 illustrates generally a diagram showing an example, comprising an electronic system 100 including control circuitry 114, an analog measurement circuit 102, and a stimulus generation circuit 106. The control circuitry 114 can include one or more fixed or programmable logic circuits. For example, the control circuitry 114 can include one or more of combinatorial logic, a state machine, microcontroller, micro-processor, memory circuit, registers, a field-programmable gate array or other programmable logic, or other circuitry. In an example, a portion or an entirety of the functionality of the control circuitry can be provided by a host controller 146 communicatively coupled through a communication interface circuit 148 to other elements of the electronic system 100. In another example, the control circuitry 114 can be embedded, such as included as a portion of an integrated circuit, integrated device package, module, or other assembly.

The control circuitry 114 can be communicatively coupled to the stimulus generation circuit 106 to control the stimulus generation circuit to generate a pulsed stimulus signal for detection of a fault in a signal path including a source 104 such as a sensor. The control circuitry 114 can be communicatively coupled to the analog measurement circuit 102, such as to control the analog measurement circuit 102 to receive a signal from the source 104. The received signal can be scaled and referred to an analog-to-digital converter circuit 110, to provide a digital representation of the received signal from the source 104. Such scaling can be performed by a resistor divider circuit 112 as shown in FIG. 1. As an illustrative example, control circuitry 114 can include, at least in part, the host controller 146 coupled to the analog measurement circuit 102 through the interface circuit 148, the host controller 146 configured to perform instructions that cause the host controller 146 to receive the representation of the pulsed stimulus signal from the analog measurement circuit 102 and to determine whether the fault exists in the signal path coupled to the input port 116. In an illustrative example, the control circuitry 114 comprises a control circuit coupled to the stimulus generation circuit 106 to control the stimulus generation circuit 106, separate from the host controller 146.

In an example, the stimulus generation circuit can be coupled to an input port 116 of the analog measurement circuit through an injection impedance such as an injection resistor 108. The injection impedance can have a magnitude larger than a source impedance associated with the source 104. The injection impedance can also have a magnitude larger than an input impedance 112 presented by the analog measurement circuit. For example, an input impedance magnitude presented by a resistor divider circuit represented by the input impedance 112 can be at least five times, at least eight times, or at least ten times smaller than a magnitude of the injection impedance represented by the injection resistor. Other illustrative examples are presented below, such as in relation to FIG. 2A, FIG. 2B, FIG. 3, and FIG. 4.

The stimulus generation circuit 106 can provide a time-varying (e.g., AC output), such as including square-wave-shaped or trapezoidal stimulation pulses such as representing binary pulses having a low-logic-level and a high-logic-level. One or more of a pulse repetition frequency, a pulse repetition rate, a duty cycle, an inter-pulse interval, or other parameters of a stimulus signal 122A can be varied by the stimulus generation circuit 106, such as under the control of the control circuitry 114. Generation of the stimulus signal 122A can be accomplished in coordination with analog acquisitions performed by the analog measurement circuit 102, such as synchronously with ADC circuit 110 sampling, under the control of the control circuitry 114. Such synchronous operation can one or more of (1) facilitate detection of the fault condition or (2) facilitate removal of any unwanted error induced by a residual representation of the stimulus signal 122B in the digital information provided by the analog measurement circuit at the output of the ADC 110, when the ADC 110 is being used to monitor a received signal from the source 104. During normal (non-fault) operation, a magnitude of the pulsed stimulus signal 122B received at the analog measurement circuit might be negligible, so such error removal need not be regarded as required. During a fault, a difference in sampled values corresponding to the upper and lower peaks (e.g., logic high and logic low) of the ADC input-referred stimulus signal 122B can be determined using sampling synchronized with such logic levels. When the difference exceeds a threshold, a fault can be declared.

FIG. 2A and FIG. 2B illustrate generally diagrams showing examples comprising an electronic system 200A in FIG. 2A and 200B in FIG. 2B in the absence and presence, respectively, of a fault along a signal path from a signal source 204 such as a sensor. The source 204 can, for example, be located remotely from the electronic system 200A or 200B. As in the example of FIG. 1, in FIG. 2A and FIG. 2B, an analog measurement circuit can include an ADC circuit 210, such as fed by a divider circuit 212. The analog measurement circuit can be used to monitor a signal from a voltage-type source circuit, such as coupled to input terminals 216A (e.g., "VIN") and 216B (e.g., "COM"), representing a single-ended input and a reference node. For example, the terminals VIN and COM can be included as a portion of an industrial input/output module, assembly, or device package. In the example of FIG. 2, only a single divider circuit 212 is shown. In another example, a second divider circuit can be included coupled between the input 216B (COM) and an inverting input of a ADC circuit 210 having differential inputs. Use of such a topology having two divider circuits can reduce or eliminate an ADC circuit 210 output error depending on the voltage Vbias used with the divider circuit 212.

Control circuitry 214 can be coupled to the ADC 210 and a stimulus generation circuit 206. The stimulus generation circuit 206 can provide a pulsed stimulus signal, such as through an injection impedance represented by a resistor 208. In FIG. 2A, during normal operation, a magnitude of the pulsed stimulus signal 222A appearing at the input terminal can be relatively small when a representation 222B of the signal is referred to the ADC 210 input. In the example of FIG. 2A, the representation 222B does not show individual pulses because, in non-fault operation, the divided-down stimulus representation 222B can have negligible amplitude, starting from the already-small amplitude of the pulsed stimulus signal 222A appearing at the input terminal. By contrast, in the presence of a fault, such as an open circuit at location 220, a magnitude of the pulsed stimulus signal 222C appearing at the input terminal can be larger. When the pulsed stimulus signal 222C is referred to the ADC 210 input through the divider circuit 212, the representation 222D, even though divided down, is also larger in the presence of a fault, and thereby indicative of the fault.

The behavior mentioned above can be described as follows. An input signal path can be defined including the source 204, a series impedance 218 representative of the source 204 impedance and any interconnects such as cables or connectors leading to the terminals 216A and 216B. If the input signal path presents a relatively low-impedance source during normal operation, then the different stimulus voltage levels provided by the stimulus generation circuit 206 (e.g., illustratively, +5V and 0V) coupled through the relatively-higher impedance injection resistor 208 can have a minimal effect on the voltage on the input terminal 216A (e.g., "VIN").

Successive ADC 210 conversions with the stimulus signal at different levels will produce successive ADC 210 results that differ very little from each other, and it can therefore be inferred that the input is correctly connected. Averaging, auto-zeroing, or other techniques such as synchronous sampling can be used to null out any detectable error induced by the stimulus signals.

If the input signal path presents a high impedance, corresponding to fault or mis-wire condition, then the different pulsed stimulus voltage levels (again, for example, +5V and 0V) coupled through the injection resistor 208 can have a relatively large effect on the voltage on the input terminal 216A, represented by the signal representation 222C in FIG. 2B. The exact value of a magnitude (e.g., a peak value) of the stimulus voltage presented at the input terminal can depend on a ratio of the resistance of the divider circuit 212 to the resistance of the injection resistor 208 (or, correspondingly, a ratio of impedance magnitudes). As an illustrative example, such a ratio could be on the order of one-to-five (1:5), one-to-eight (1:8), one-to-ten (1:10) or some other ratio.

In the illustrative example of FIG. 2B, successive ADC 210 conversions with the stimulus signal at different levels (e.g., a low-value pulse level and a high-value pulse level) will produce successive ADC 210 results that differ significantly from each other, and it can be inferred that the input is incorrectly connected or experiencing a fault in view of the resulting ADC output data because the representation 222D will be present at the ADC input. A magnitude of the representation 222D, or a magnitude of such a difference between low and high levels of the representation 222D can be established, such as based on knowledge of resistor ratios, to automatically determine whether a detected level (or difference in levels) should be considered as representative of an open-circuit or other fault condition. Fault detection can be performed in the digital domain, such as using a digital representation of the pulsed stimulus signal or other information from the ADC 210. For example, a difference can be determined between two digital values corresponding to samples obtained from the ADC 210 in the presence of the low and high levels of the pulsed stimulus representation 222D, respectively. If the difference exceeds a specified threshold, then a fault can be declared.

The pulsed stimulus signal can be generated in a manner synchronous with the ADC conversion, such as in response to control circuitry 214 configured to trigger or otherwise control ADC 210 conversions. As an illustrative example, the pulsed stimulus signal can be injected using a relatively high-valued injection resistor, such as having a value of about 10 MΩ with such an injection resistor coupled to the system input terminal 216A (e.g., "VIN").

In the input signal path, a source 204 of the signal to be measured by the ADC 210 can provide a relatively low output impedance 218, such as much smaller than 1 kΩ. When the source is properly connected to the resistor divider 212 and the injection resistor 208, the source 204 will effectively short, or at least significantly load the pulsed stimulus signal, such as providing the representation 222A shown in FIG. 2A. Accordingly, in normal (e.g., non-fault) operation, a portion of the pulsed stimulus signal appearing on the system input terminal will be small, and a very small residue pulsed signal will be present on the ADC 210 input, as shown by the representation 222B. The residue signal can be filtered from the ADC 210 output data using various techniques as mentioned above.

During a fault or mis-wire scenario, such as when the source gets disconnected from the system input, the pulse stimulus signal will be present on the system input terminal 216A and also on the ADC 210 input. In an illustrative example, a pulsed stimulus signal present on the ADC 210 input will be attenuated by factor of approximately ten between a 10 MΩ injection resistor and the 1 MΩ input divider, and further attenuated—such as by another factor of eight—at the ADC 210 input. Use of a divider 212 ratio of eight is merely illustrative, and other divider 212 ratios can be used. Such attenuation will result in a representation of the stimulus signal having an amplitude of 50 milliVolts (mV) to 60 mV on the ADC 210 input, which can be detected as a difference between results of conversions, such as where the conversions are obtained synchronously with the two levels of a square-wave stimulus waveform (e.g., where the stimulus waveform is provided having levels toggling between 0V and 5V).

Figure 3:
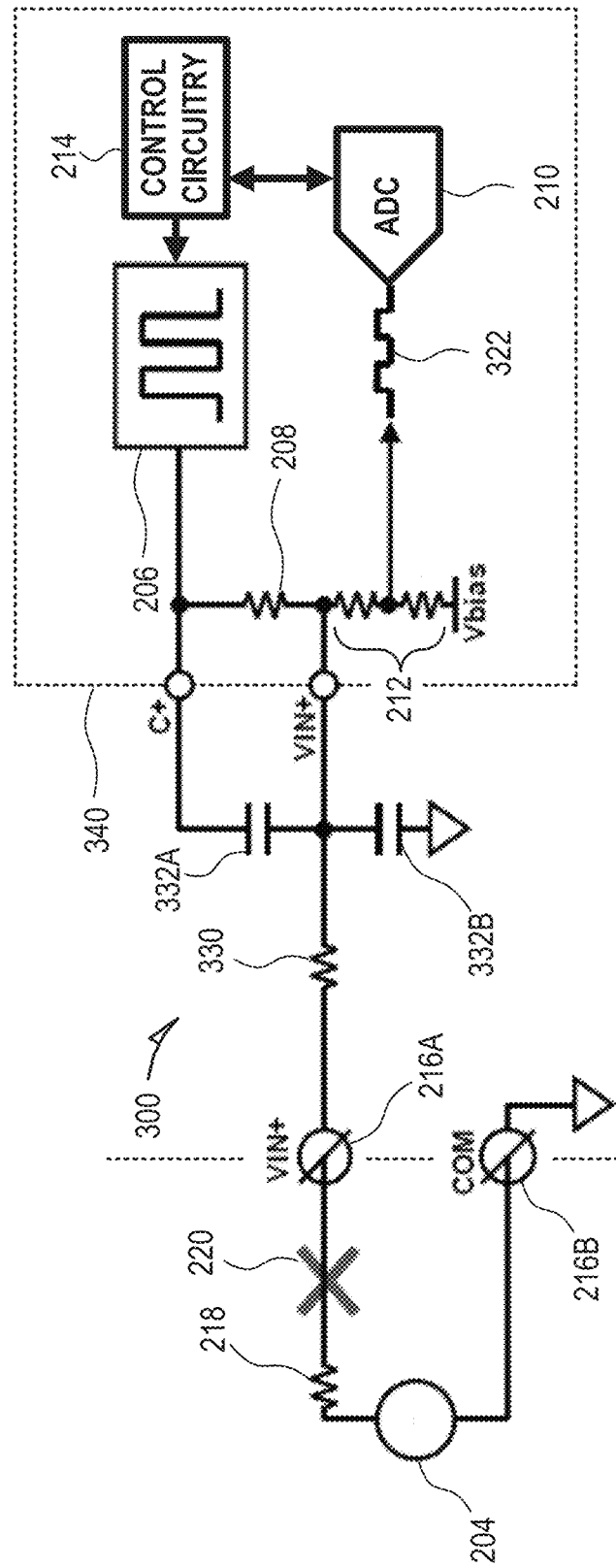
FIG. 3 illustrates generally an example comprising an electronic system such as including a capacitor, such as for one or more of compensation, interference suppression, or protection.

FIG. 3 illustrates generally an example comprising an electronic system 300 such as can include a capacitor 332A, such as for compensation related to providing a stimulus signal. In the example of FIG. 3, a measurement circuit 340 such as an integrated circuit package or other integrated module can include control circuitry 214, a stimulus generation circuit 206, an ADC 210, and a divider circuit 212 coupled to the ADC 210 input. An injection resistor 208 can be used to couple a pulsed stimulus signal from the stimulus generation circuit 206 to an input pin VIN+ on the measurement circuit 340. One or more capacitors, such as a capacitor 332A can be placed in parallel with the injection resistor 208 or elsewhere, such as to counter a possible long time constant of the stimulus signal on the VIN+ established due to use of a relatively large resistor for the injection resistor 208, and a potentially large amount of capacitance, including parasitic capacitance, presented at the input terminal. Another capacitor 332B can be included such as for one or more of protection or filtering, such as for use in combination with a series resistor 330 to provide an RC input filter. In an illustrative example, one or more of the compensation capacitor 332A or the second capacitor 332B can have a value of about 1 nanoFarad (nF) and the series resistor 330 can provide a value of about 1 kΩ. In another illustrative example, the compensation capacitor 332A can have a value of 680 picoFarads (pF), the second capacitor 332B can have a value of 4.7 nF, and the series resistor 330 can have a value of 180Ω.

As mentioned elsewhere, the detection technique described herein can be implemented using an integrated circuit or an embedded system. For example, an integrated circuit device package can provide general-purpose input/output pins. As shown in the illustration of FIG. 3, an output of the stimulus generation circuit 206 can represent a digital output pin or general-purpose input/output (GPIO) pin present on an integrated circuit (IC) device package or module package. As an illustrative example, an AD717x-series analog-to-digital conversion circuit (available from Analog Devices, Inc., Norwood, Mass., USA) can be used as a source of a square-wave excitation signal from one its GPIO ports and can also provide the ADC 210. A 10 MΩ injection resistor 208 can be used for coupling the stimulus signal to the divider circuit 212, such as one injection resistor per each voltage measurement channel.

If a resistor package or integrated resistors are used, the injection resistor 208 can be included as a portion of the front-end resistor package or "pack," or the resistors can be included as a portion of a commonly-shared integrated circuit package housing the ADC 210 circuit. The injection resistor 208 can approximately track a resistance of the input divider 212, but the injection resistor need not adhere to the same precision specification as the divider 212 resistors, because the injection resistor 208 generally does not directly affect the input divider 212 accuracy or voltage measurements derived therefrom. In the presence of a high-impedance or open-circuit fault in the signal path coupled to the input port defined by terminals 216A and 216B, a representation 322 of the pulsed stimulus signal will be detectable by the ADC 210.

Figure 4:
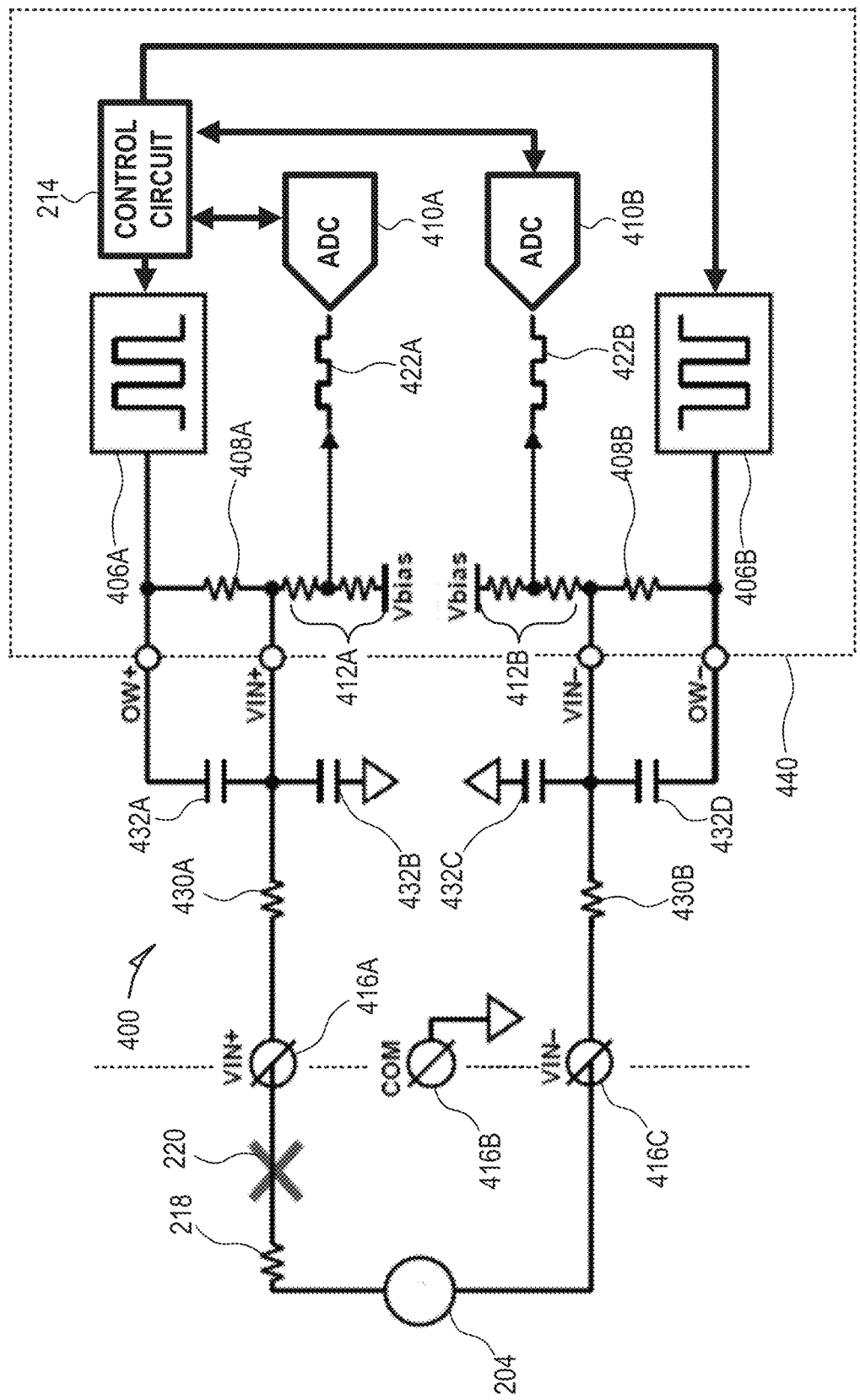
FIG. 4 illustrates generally an example comprising an electronic system, such as having a differential analog input and respective pulse generation circuit outputs.

FIG. 4 illustrates generally an example comprising an electronic system 400, such as having a differential analog input (such as represented by first and second voltage input terminals 416A and 416C, and a correspondence reference terminal 416B (e.g., represented as VIN+, VIN−, and COM, respectively), and respective pulse generation circuit outputs provided by stimulus generation circuits 406A and 406B.

As in other examples herein, the electronic system 400 can include a measurement circuit 440, such as housed in a module or integrated circuit device package (or other assembly). The measurement circuit 440 can include or can be coupled to control circuitry 214, such as arranged to control respective ADC circuits such as a first ADC circuit 410A and a second ADC circuit 410B, or in an example, the first ADC circuit 410A and the second ADC circuit 410B can be a single ADC circuit having a differential input. The first and second ADC circuits 410A and 410B can represent measurement channels arranged to sample respective first and second polarities of an input port comprising input VIN+ and VIN−. In the illustrative example of FIG. 4, a first injection resistor 408A can be coupled between a first stimulus generation circuit 406A output and a first divider circuit 412A.

As in other examples, a compensation capacitor 432A and a protection filter including a second capacitor 432B and a first series resistor 430A can be included, such as coupled as shown in FIG. 4 to OW+ and VIN+ nodes (e.g., pins) on the measurement circuit 440. A second injection resistor 408B can be coupled between a second stimulus generation circuit 406B output and a second divider circuit 412B, a second compensation capacitor 432D and another protection filter including a fourth capacitor 432C and a second series resistor 430B can be coupled to the VIN− and OW− nodes on the measurement circuit 440. In this manner, two input channels (leading to the first and second ADCs 410A and 410B) can be provided defining a differential input port. The differential input port (including terminals 416A and 416C) can be coupled to a source 204 and its corresponding equivalent source resistance 218 (with such a combination of source 204 and source resistance 218 representing a voltage output from a sensor, for example). As shown illustratively in FIG. 4 and in FIG. 6, the first and second stimulus generation circuits 406A and 406B can provide outputs that are logical complements of each other or otherwise opposite in polarity, such as producing corresponding representations 422A and 422B once coupled through the injection resistors 408A and 408B, respectively, and dividers 412A and 412B, respectively.

Such representations 422A and 422B can be greater in magnitude, or can exhibit a greater difference between each other in magnitude in the presence of an open circuit or other fault 220. In general, faults in the signal paths to the first and second terminals 416A and 416C can cause a change in either the individual representations 422A or 422B, a difference between high and low levels in the individual representations 422A or 422B, respectively, or a change in a magnitude of a difference between the representations 422A and 422B, as illustrative examples. Detection of a fault can include evaluating one or more differences as mentioned above, such as in the digital domain using information acquired from one or more of the first or second ADCs 410A or 410B.

In the illustrative examples of FIG. 3 and FIG. 4, AD717x GPIO pins can be connected to a pin outside the package, marked as "C+" in FIG. 3 and OW+/OW− in FIG. 4, and external capacitors such as a capacitor 332A can be connected on a per-channel basis such as to compensate for AC stimulus signal attenuation by the input filter capacitor (e.g., capacitor 332B) or also to compensate for capacitance connected externally to the system input, such as parasitic capacitance of cabling from a sensor coupled to the input, with such as sensor represented as a source 204 and series impedance (e.g., series resistor 218) representing the source 204 resistance.

In one approach, a module or printed circuit board including the conversion circuit can include an input filter capacitance (e.g., capacitor 332B) having a value higher than the expected external parasitic or other source capacitance, as the AC signal compensation will be less affected by the source capacitance. The proposed techniques described herein are also applicable to a differential topology, as shown illustratively in FIG. 4, such as where the positive and negative input AC stimulus square-wave can be driven using complementary phasing.

Figure 5:
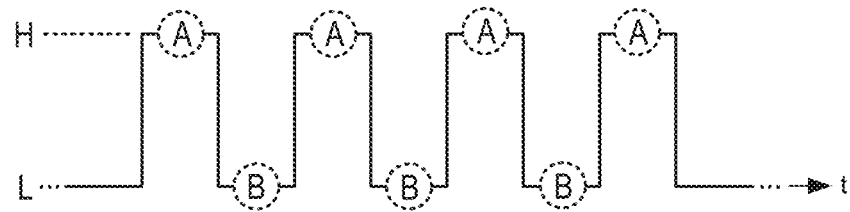
FIG. 5 illustrates generally an illustrative example of a pulsed stimulus waveform, and corresponding synchronous analog acquisition events.
Figure 6:
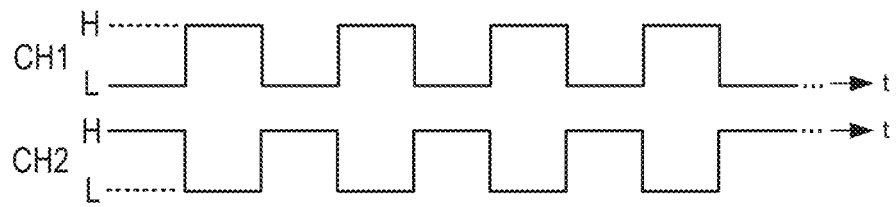
FIG. 6 illustrates generally an illustrative example of a pulsed stimulus waveform, such as having first and second signal components that are complementary to each other.

FIG. 5 illustrates generally an illustrative example of a pulsed stimulus waveform such as can be provided by a stimulus generation circuit as mentioned in other examples (e.g., either using a dedicated circuit, or a general purpose digital output such as a GPIO port configured in a digital output mode), and corresponding synchronous analog acquisition events. To allow detection of an open circuit (or another high impedance fault condition) on an input, an ADC can be controlled to perform a sequence of conversions, wherein a first ADC conversion is performed with the first controlled stimulus signal at a first voltage level or logic state (and optionally, as shown in FIG. 6, a second stimulus signal at a second voltage level or logic state for a differential embodiment, where the second voltage level or logic state can be a complement of the first voltage level or logic state). Another ADC conversion can be performed with the first stimulus signal at a second voltage level or second logic state (and optionally the second stimulus signal at a first voltage level or logic state).

In the example of FIG. 5, during a logic "high" state, "H," such as corresponding to a logic-high-level (e.g., 3.3V, 5V, or some other level) at the stimulus generator output, acquisitions at one or more times labeled "A" can occur. During a logic "low" state, "L," such as corresponding to a logic-low-level at the stimulus generator output (e.g., 0V), acquisitions at one or more times labeled "B" can occur. A magnitude of a difference between a sampled value at the ADC input corresponding to an "A" acquisition and a sampled value at the ADC input corresponding to a "B" acquisition can be indicative of a presence or absence of a fault condition. For example, if such a magnitude is greater than a specified threshold, a fault can be declared or flagged. Other techniques can be used to inhibit or suppress measurement error due to a presence of the pulsed stimulus signal.

FIG. 6 illustrates generally an illustrative example of a pulsed stimulus waveform, such as having first and second signal components that are complementary to each other, represent by the plots corresponding to CH1 and CH2 in FIG. 6. The signal components in FIG. 6 can be generated using respective stimulus generation outputs configured to provide logical complements of each other, or such waveforms can be provided from a stimulus generation circuit configured to provide a differential output directly. As mentioned in relation to other examples herein, use of a differential output can provide fault detection when a sensor or other source is connected to a differential input port of a measurement circuit. The examples shown in FIG. 5 and FIG. 6 are illustrative, and other variations can be used such as varying one or more of a pulse repetition frequency, a pulse repetition rate, a duty cycle, an inter-pulse interval, or other parameters of the pulsed stimulus signal.

Figure 7:
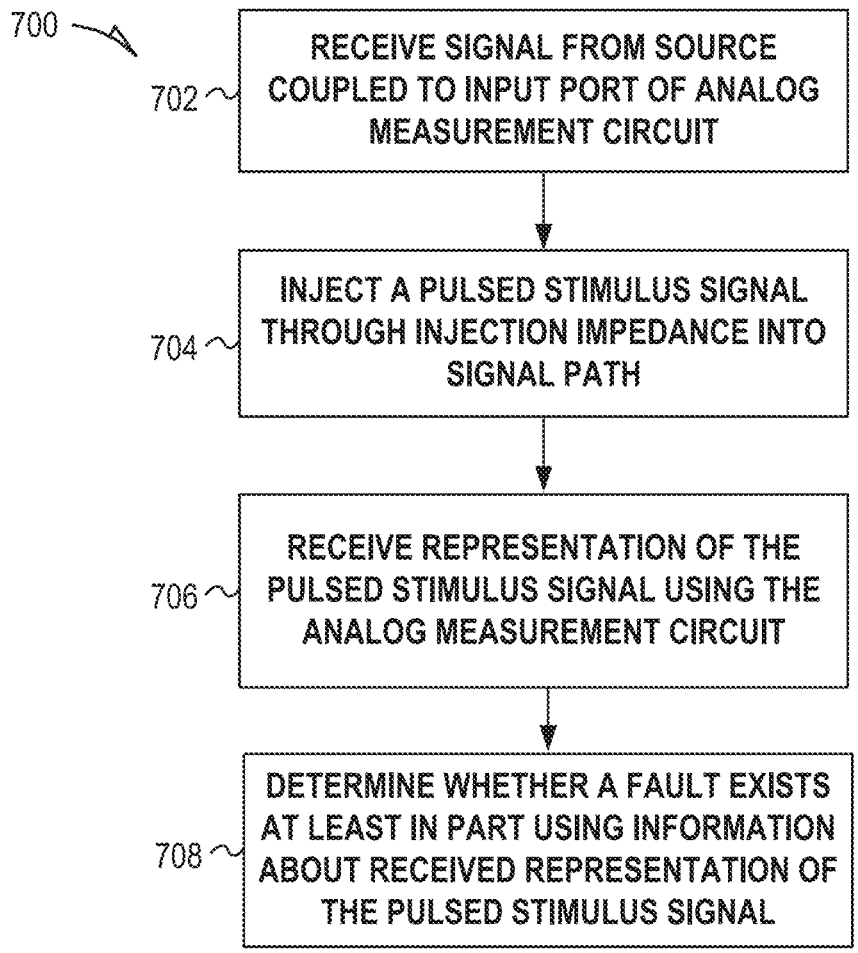
FIG. 7 illustrates generally a technique, such as a method, that can include injecting a pulsed stimulus signal through an injection impedance and receiving a representation of the pulsed stimulus signal detected using an analog measurement circuit.

FIG. 7 illustrates generally a technique, such as a method 700, that can include injecting a pulsed stimulus signal through an injection impedance and receiving a representation of the pulsed stimulus signal detected using an analog measurement circuit. The method 700 can be implemented using one or more electronic systems shown in other examples herein. For example, at 702, a signal from a source (e.g., a sensor located remotely with respect to the measurement circuit) can be received using an analog measurement, such as a source coupled to an input of the analog measurement circuit. At 704, a pulsed stimulus signal can be injected through an injection impedance (such as a resistor) into a signal path including the source and the analog measurement input. At 706, a representation of the pulsed stimulus signal can be received from the analog measurement circuit, such as a representation coupled to an ADC circuit input through a divider circuit.

At 708, a determination can be made, such as automatically using a host controller, control circuitry, or another technique, such as using information about a received representation of the pulsed stimulus signal. As mentioned in other examples herein, such information can include a difference between values of the representation of the pulsed stimulus signal corresponding to high and low logic states of the pulsed stimulus, or other values. Generally, if a magnitude of the pulsed stimulus signal in a high state, or a difference between magnitudes of the pulsed stimulus signal between high and low states exceeds a specified threshold, a fault can be flagged corresponding to an open-circuit condition or other similar fault where an unwanted high impedance is present along the signal path to the source.

Various Notes

Each of the non-limiting aspects described in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic system equipped to detect a fault in a signal path coupled to an input port of the electronic system, the electronic system comprising:
   an analog measurement circuit configured to receive a signal from a source coupled to the input port, the analog measurement circuit comprising an analog-to-digital converter (ADC) circuit configured to provide a digital representation of the received signal from the source, the analog measurement circuit including a divider circuit configured to scale the signal from the source for presentation to an input of the ADC;
   a stimulus generation circuit coupled to the input port through an injection impedance including a resistor, the injection impedance having a value greater in magnitude than a source impedance associated with the source;
   control circuitry coupled to the analog measurement circuit and the stimulus generation circuit, the control circuitry configured to:
     control the stimulus generation circuit to generate a pulsed stimulus signal for fault detection;
     receive a representation of the pulsed stimulus signal using the analog measurement circuit; and
     determine whether a fault exists in the signal path coupled to the input port at least in part using information about a magnitude of the representation of the pulsed stimulus signal received from the analog measurement circuit.

2. The electronic system of claim 1, wherein the control circuitry comprises, at least in part, a host controller coupled to the analog measurement circuit through an interface circuit, the host controller configured to perform instructions that cause the host controller to receive the representation of the pulsed stimulus signal received from the analog measurement circuit and to determine whether the fault exists in the signal path coupled to the input port.

3. The electronic system of claim 2, wherein the control circuitry comprises a separate control circuitry coupled to the stimulus generation circuit to control the stimulus generation circuit.

4. The electronic system of claim 1, wherein the control circuitry is configured to control the stimulus generation circuit to provide the pulsed stimulus signal in a manner that is synchronized with analog signal acquisitions of the received signal from the source performed by the analog-to-digital converter circuit.

5. The electronic system of claim 1, wherein the pulsed stimulus signal is binary- valued comprising a low-valued level and a high-valued level; and
   wherein the control circuitry is configured to determine whether the fault exists at least in part using information indicative of a difference between values of samples from the ADC circuit corresponding to the low-valued level and the high-valued level of the stimulus signal.

6. The electronic system of claim 5, wherein the control circuitry is configured to determine that the fault exists when the difference exceeds a specified threshold.

7. The electronic system of claim 1, wherein the analog measurement circuit includes a differential input comprising a positive input terminal and a negative input terminal; and
   wherein the stimulus generation circuit is amongst respective stimulus generation circuits including a first stimulus output coupled to the positive input terminal and a second stimulus output coupled to the negative input terminal; and wherein the control circuitry is configured to control the respective stimulus generation circuits to provide a first pulsed stimulus signal at the first stimulus output and to contemporaneously provide a complementary second pulsed stimulus signal at the second stimulus output.

8. The electronic system of claim 7, wherein the control circuitry is configured to provide the digital representation of the received signal from the source including inhibiting or suppressing an error due to a presence of the stimulus signal.

9. The electronic system of claim 8, wherein the inhibiting or suppressing the error includes averaging analog acquisitions performed by the analog-to-digital converter circuit.

10. The electronic system of claim 1,
wherein the divider circuit comprises a resistor divider circuit, the resistor divider circuit configured to scale the signal from the source for presentation to an input of the ADC.

11. The electronic system of claim 10, comprising a capacitor in parallel with the resistor of the injection impedance.

12. The electronic system of claim 1, wherein the stimulus generation circuit comprises a general-purpose programmable digital output provided by the electronic system; and
wherein the injection impedance comprises a circuit coupled between an output pin corresponding to the general-purpose programmable digital output, and the input port of the analog measurement circuit.

13. The electronic system of claim 1, further comprising the source;
wherein the source comprises a sensor device.

14. An electronic system, equipped to detect a fault in a signal path coupled to an input port of the electronic system, the electronic system comprising:
an analog measurement circuit configured to receive a signal from a source coupled to a differential input comprising first and second input terminals, the analog measurement circuit comprising resistor divider circuits for each of the first and second input terminals, the resistor divider circuits configured to scale the signal from the first and second input terminals for presentation to the ADC;
stimulus generation outputs coupled to the first and second input terminals through respective injection impedances comprising resistors;
control circuitry coupled to the analog measurement circuit, the control circuitry configured to:
control the stimulus generation outputs to generate a pulsed stimulus signal comprising respective signal components coupled to the first and second input terminals;
receive a representation of the pulsed stimulus signal using the analog measurement circuit; and
determine whether a fault exists in a signal path coupled to the input port at least in part using information about a magnitude of the representation of the pulsed stimulus signal received from the analog measurement circuit.

15. The electronic system of claim 14, wherein the control circuitry is configured to control the stimulus generation outputs to provide the pulsed stimulus signal in a manner that is synchronized with analog signal acquisitions, by the analog measurement circuit, of the received signal from the source.

16. The electronic system of claim 14, wherein the control circuitry is configured to inhibit or suppress an error due to a presence of the pulsed stimulus signal by averaging information indicative of analog acquisitions performed by the analog measurement circuit.

17. A method for detecting a fault in a signal path coupled to an input port of an electronic system, the method comprising
using an analog measurement circuit, receiving a signal from a source coupled to an input port of the analog measurement circuit through a divider circuit configured to scale the signal from the source for presentation to an analog-to-digital (ADC) converter circuit included as a portion of the analog measurement circuit;
injecting a pulsed stimulus signal through an injection impedance, including a resistor, into the signal path, the injection impedance having a value greater in magnitude than a source impedance associated with the source;
receiving a representation of the pulsed stimulus signal using the analog measurement circuit; and
determining whether a fault exists in the signal path coupled to the input port at least in part using information about a magnitude of the received representation of the pulsed stimulus signal from the analog measurement circuit.

18. The method of claim 17, wherein the injecting the pulsed stimulus and performing analog signal acquisitions of the received signal from the source are accomplished in a synchronous manner, the analog signal acquisitions performed using the analog measurement circuit to receive the representation of the pulsed stimulus signal.

19. The method of claim 17, wherein receiving the signal from source includes receiving a differential signal using first and second input terminals of the input port; and wherein injecting the pulsed stimulus signal includes injecting first and second pulsed stimulus signal components into the first and second input terminals, respectively.

20. The method of claim 19, comprising inhibiting or suppressing error due to a presence of the pulses stimulus signal by averaging information indicative of analog acquisitions performed by the analog measurement circuit.

* * * * *